United States Patent
Yao et al.

(10) Patent No.: US 9,496,464 B2
(45) Date of Patent: Nov. 15, 2016

(54) LIGHT EMITTING DEVICE AND TV BACK-LIGHT MODULE WITH WIDE COLOR GAMUT

(71) Applicant: APT Electronics Ltd., Guangzhou (CN)

(72) Inventors: Shuguang Yao, Guangzhou (CN); Chuiming Wan, Guangzhou (CN); Ruxi Liu, Guangzhou (CN); Zhaoming Zeng, Guangzhou (CN); Zhirong Jiang, Guangzhou (CN); Guowei Xiao, Guangzhou (CN); Weineng Ou, Guangzhou (CN)

(73) Assignee: APT ELECTRONICS LTD., Guangzhou (CN)

( * ) Notice: Subject to any disclaimer, the term of this patent is extended or adjusted under 35 U.S.C. 154(b) by 0 days.

(21) Appl. No.: 14/584,482

(22) Filed: Dec. 29, 2014

(65) Prior Publication Data
US 2016/0087162 A1   Mar. 24, 2016

(30) Foreign Application Priority Data

Sep. 18, 2014   (CN) .......................... 2014 1 0480126

(51) Int. Cl.
*H01J 1/62* (2006.01)
*H01L 33/50* (2010.01)
*G02F 1/1335* (2006.01)

(52) U.S. Cl.
CPC .......... *H01L 33/504* (2013.01); *H01L 33/501* (2013.01); *G02F 1/133603* (2013.01)

(58) Field of Classification Search
CPC ......................... H01L 33/504; H01L 2924/00
USPC ................................... 313/501, 506
See application file for complete search history.

(56) References Cited

U.S. PATENT DOCUMENTS

| | | | |
|---|---|---|---|
| 8,410,508 B1 | 4/2013 | Yen et al. | |
| 8,482,191 B2 | 7/2013 | Berben et al. | |
| 8,669,578 B2 | 3/2014 | Shibamoto et al. | |
| 2006/0060867 A1* | 3/2006 | Suehiro | H01L 33/56 257/81 |

* cited by examiner

*Primary Examiner* — Vip Patel
(74) *Attorney, Agent, or Firm* — Robert P. Michael, Esq.; Carter, DeLuca, Farrell & Schmidt, LLP

(57) ABSTRACT

The present invention provide an light emitting device (LED) with wide color gamut (high NTSC), and a LED backlight module with the light emitting device, the light emitting device includes at least one LED chip, wherein the LED chip is a blue or ultraviolet (UV) LED chip, the light-out surface of the LED chip is covered by a phosphor-converted layer which consists of phosphor converted materials and thermosetting colloid materials, the phosphor converted materials contain green-converted phosphor, red-converted phosphor and a special phosphor material that has strong light-absorbing properties in the wavelength range of 460-510 nm. The present invention can reduce the stringent requirements of phosphor FWHM that needs to meet for conventional high NTSC solution.

16 Claims, 3 Drawing Sheets

LIGHT EMITTING DEVICE AND TV BACK-LIGHT MODULE WITH WIDE COLOR GAMUT

CROSS-REFERENCE TO RELATED APPLICATION

The present application claims priority of Chinese Patent Application No. CN 201410480126.3 filed on Sep. 18, 2014, the entire content of which is incorporated herein by reference.

FIELD OF THE INVENTION

The present invention relates to technology of light emitting device (LED), and more particularly, to a light emitting device and a TV back-light module with wide color gamut (high NTSC).

BACKGROUND INFORMATION

The color effect and gamut of liquid crystal display (LCD) TV is getting more and more attention currently. The wide color gamut has become a new development tendency for TV backlight. Color gamut is quantitatively measured by NTSC. Higher NTSC shows better ability of color display. Each pixel of LCD TV consists of three color (R, G and B) rectangular blocks. The color display ability depends on the performance of back-light module and color filtering film. Cold cathode fluorescent lighting (CCFL) is normally used as back light for conventional TV module, in which NTSC is only 65% to 75%. LED as a new lighting source, which has advantages such as high reliability, energy saving, environmental protection, will gradually replace the traditional CCFL lighting. The NTSC performance can normally reach 72% to 80% when using blue LED+YAG phosphor. However, NTSC value can be achieved to 80% or more while using blue LED+Green/Red (G/R) phosphor. Full width at half maximum (FWHM) of G/R phosphor will affect the performance of NTSC. Generally the smaller FWHM of G/R phosphor will cause higher NTSC. If FWHM of G/R phosphor is achieved to less than 50 nm, the NTSC could be easy to reach 90%. However, FWHM is hard to be achieved to less than 50 nm for conventional Green phosphor and 70 nm for Red phosphor used in LED, which results in a limit of NTSC performance for LED package using conventional phosphor.

Currently it has become an important way to find a kind of phosphor with small FWHM to achieve the wide color gamut. For example, using nanometer-scaled material quantum dot (QD) and non-rare earth red phosphor $K_2SiF_3/Mn$, in which FWHM can reach less than 30 nm, the NTSC performance is easy to reach 95%, even more than 100%. However, these materials have strong toxicity, which would limit their application to a certain extent.

The FWHM of red or green LED chip is less than 40 nm. Compared with red/green phosphor, red/green LED chip has smaller FWHM. If the red/green LED chips are used in TV backlight, the NTSC performance is easy to reach more than 90%. The difficult point of this solution is how to adjust the ratio of different LED color chips to obtain a desired color coordinate point. Moreover, adding the red/green chips in TV back-light will result in cost increases.

Thus it become a technical barrier for the people in the art to find a method to reduce the stringent requirements of phosphor FWHM based on conventional phosphor converted package, so as to achieve much wider color gamut.

SUMMARY

The present invention provides a phosphor-converted LED device with wide color gamut (high NTSC), which can reduce the stringent requirements of phosphor FWHM that needs to meet for conventional high NTSC solution.

The LED device with wide color gamut (high NTSC) includes at least one LED chip. The LED chip is a blue or ultraviolet (UV) LED chip. The light-out surface of the LED chip is covered by a phosphor-converted layer. The phosphor-converted layer consists of phosphor converted materials and thermosetting colloid materials. The phosphor converted materials include green-converted phosphor, red-converted phosphor and a special phosphor that has strong light-absorbing properties at the 460-510 nm wavelength.

Preferably the phosphor-converted layer contains 0.5% to 10% by weight of the special phosphor materials with strong light-absorbing properties. The percentage of the special light-absorbing phosphor materials in the phosphor-converted layer will greatly affect the NTSC and brightness performance of LED device. This invention shows that the optimal weight percentage of the special light-absorbing phosphor materials is controlled from 0.5% to 10%, which can obtain the best NTSC and brightness for LED device. If the weight percentage is too low, the NTSC increasing effect is not obvious. If the weight percentage is too high, the brightness of LED device will be reduced.

The phosphor-converted layer is formed by mixing phosphor converted materials and thermosetting colloid materials. As a normal LED package technology, the skilled people can determine the concentration of green phosphor and red phosphor, and the dose of colloidal mixture to obtain a desired color point through repeated adjustment.

In addition, the special phosphor materials with strong light-absorbing properties in the wavelength range of 460-510 nm have the following characteristics: Peak wavelength is in the range of 460-510 nm, FWHM is less than 40 nm, absorption coefficient is in the range of $10^4$-$10^6$ $L \cdot mol^{-1} \cdot cm^{-1}$, no light is emitted or the emitting light is very weak in the wavelength range of 550-610 nm. Preferably the phosphor materials with these properties can be used to absorb the blue or green light that has negative affect to NTSC performance, such that the NTSC of LED device will be increased.

Particularly, the special phosphor material with strong light-absorbing properties is made up of one kind or several kinds of materials, including β-sialon doped by $Pr^{3+}$, tungstate and organic compound, which have strong light-absorption in the wavelength range of 460-510 nm.

Preferably, for the green phosphor-converted material, its peak wavelength is in the range of 510-545 nm and FWHM is less than 70 nm. Particularly the green phosphor-converted material is included of one kind or several kinds of materials including β-sialon doped by $Eu^{2+}$, silicate and quantum dot. The quantum dot includes CdS, CdSe, ZnS, ZnSe, InP and others.

Preferably, for the red phosphor-converted material, its peak wavelength is in the range of 620-670 nm and FWHM is less than 100 nm. Particularly the red phosphor-converted material is included of one kind or several kinds of materials including nitride, silicate, quantum dot, $K/Na_2SiF_6:Mn^{4+}$ and $K/Na_2TiF:Mn^{4+}$. The quantum dot includes CdS, CdSe, ZnS, ZnSe, InP and others.

The thermosetting colloid materials are included of one kind or several kinds of materials including silicone, silicone resin and epoxy resin.

The invention provides a high NTSC LED device that can be used in LED back-light module such as side-entering type or direct type module to obtain a wide color gamut.

The invention provides a technical solution that has the following benefits:

1. This invented new-structured LED device, in which some special light-absorbing phosphor materials in the wavelength range of 460-510 nm are added into the phosphor-converted layer, will reach much higher NTSC performance through the absorption effects of the special light-absorbing phosphor materials to the specific wavelength light. In the meantime, these special light-absorbing phosphor materials will not affect the intensity of normal green and blue emitting peak.

2. Compared with conventional G/R phosphor packaged LED device, this invented LED device has lowered the stringent requirements for green phosphor FWHM to obtain high NTSC.

3. This invention can obtain the widest color gamut compared with other high NTSC solutions including pure G/R phosphor packaging, new narrower FWHM phosphor packaging and green/red chip mixing method.

4. The NTSC performance of this invented LED device can reach more than 90%.

DETAILED DESCRIPTION

Figure 1:
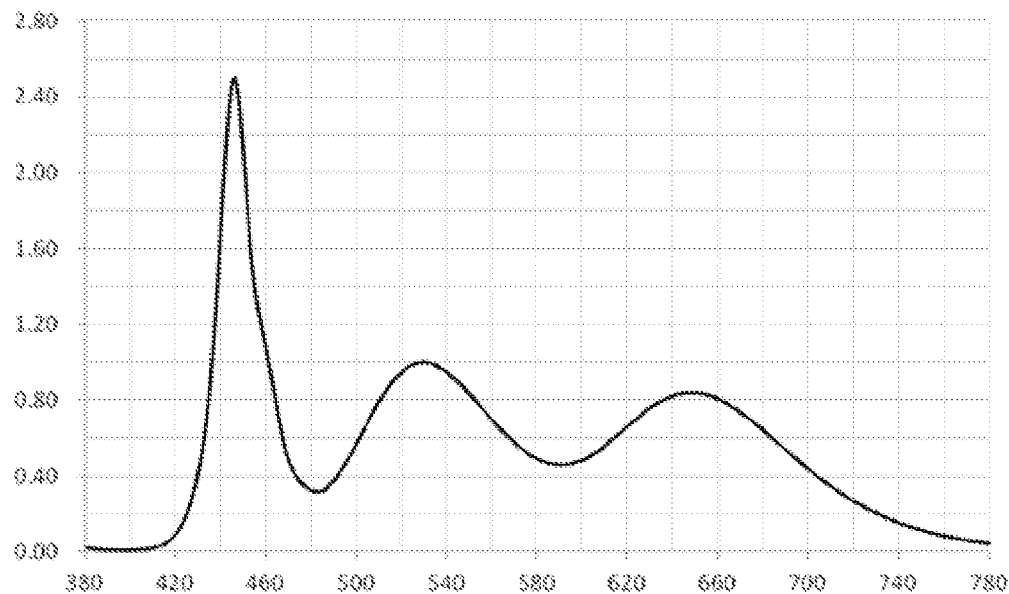
FIG. 1 is typical spectra of conventional R/G phosphor package.

The present invention provides a LED device with wide color gamut, including at least one LED chip. The LED chip is a blue or ultraviolet (UV) LED chip. Compared with existing phosphor-converted LED device, the present invention provides the primary improvements that the light-out surface of the LED chip is covered by a phosphor-converted layer which consists of phosphor converted materials and thermosetting colloid materials, wherein the phosphor converted materials include green-converted phosphor, red-converted phosphor and a special phosphor that has strong light-absorbing properties in the wavelength range of 460-510 nm. The phosphor-converted layer contains 0.5%-10% by weight of the special phosphor materials with strong light-absorbing properties. Preferably the special phosphor materials with strong light-absorbing properties in the wavelength range of 460-510 nm have the following characteristics: Peak wavelength is in the range of 460-510 nm, FWHM is less than 40 nm, absorption coefficient is in the range of $10^4$-$10^6$ L·mol$^{-1}$·cm$^{-1}$, no light is emitted or the emitting light is very weak in the wavelength range of 550-610 nm. The phosphor materials with these properties will absorb the blue or green light that has negative affect to NTSC performance, such that the NTSC of LED device will be increased.

The invention will be described in more details hereinafter with reference to the accompanying drawings and exemplary embodiments.

Embodiment 1

The LED device includes at least one blue LED chip whose emitting wavelength is the range of 445 nm-457.5 nm, its phosphor-converted layer consists of silicone, green-converted phosphor, red-converted phosphor and a special phosphor that has strong light-absorbing properties in the wavelength range of 460-510 nm. The green-converted phosphor is β-sialon green phosphor having the peak wavelength of 525-535 nm and FWHM of 50-60 nm; the red-converted phosphor is nitride red phosphor having the peak wavelength of 660-670 nm and FWHM of 90-100 nm; In this embodiment, the special light-absorbing phosphor is β-sialon compound $Si_{6-z}Al_zO_zN_{8-z}:Pr_x$ that has strong light-absorbing properties in the wavelength range of 460-510 nm.

In this embodiment, in more details, the proportion and concentration of β-sialon green and nitride red phosphor is determined by the desired color coordinate point of LED device, the desired color coordinate point is (0.26, 0.23) for LED device, the weight proportion of green and red phosphor is 9:1, the weight percentage of both β-sialon green plus nitride red phosphor in the phosphor-converted layer is 20%, the weight percentage of the special light-absorbing phosphor $Si_{6-z}Al_zO_zN_{8-z}:Pr_x$ in the phosphor-converted layer is 2%, the rest of the phosphor-converted layer is silicone. The fabrication method of the LED device includes the steps: (a) LED chip 102 is attached in leadframe 101, mechanical and electrical connections between LED chip 102 and leadframe 101 are accomplished. (b) The mixture is formed by mixing three kinds of phosphor into the colloid. The three kinds of phosphor include β-sialon green, nitride red phosphor and special light-absorbing phosphor $Si_{6-z}Al_zO_zN_{8-z}:Pr_x$. (c) The mixture is dispensed into the leadframe with controlled proper volume, and the mixture covers the surface of LED chip 102, and finally the phosphor-converted layer 103 is formed after curing.

Figure 3:
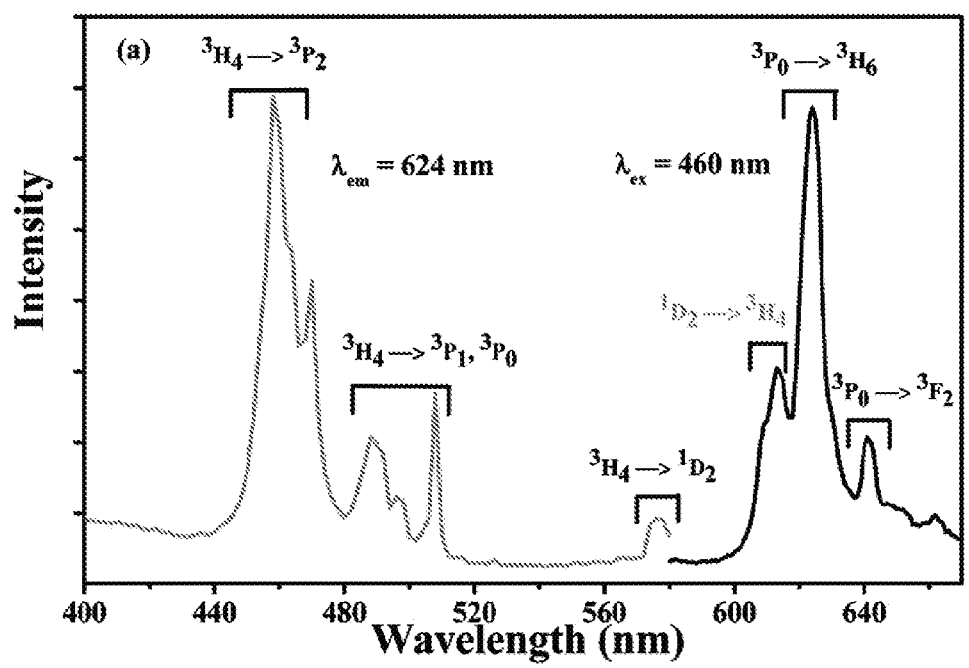
FIG. 3 is emitting spectra of the LED device according to the embodiment 1 of the present invention.

In this embodiment, the additive β-sialon $Si_{6-z}Al_zO_zN_{8-z}:Pr_x$ has a strong absorption peak in the wavelength range of 460-500 nm, so it can effectively absorb the light in the overlapping region of chip blue light and green phosphor emitting light. Moreover, the emitting peak wavelength of the additive β-sialon $Si_{6-z}Al_zO_zN_{8-z}:Pr_x$ is in the range of 600-640 nm. It is noticed that the emitting light in the wavelength range of 600-610 nm may reduce the NTSC performance. However, the emitting light in the wavelength range of 610-640 nm is obviously much stronger than the emitting light in the wavelength range of 600-610 nm, which can make up the NTSC performance loss caused by the emitting light in the wavelength range of 600-610 nm. Compared with conventional LED device fabricated only using G/R phosphor, this embodiment of present invention provides a LED device in which NTSC performance can increase 1-5%, and maximum NTSC performance can reach more than 95%. In addition, the emitting red light, in the peak wavelength of 610-640 nm, of the additive β-sialon $Si_{6-z}Al_zO_zN_{8-z}:Pr_x$ also can increase the brightness of LED device while increasing NTSC performance. FIG. 3 gives the emitting spectra of the LED device according to this embodiment of the present invention.

Embodiment 2

The LED device almost has the same structure as the embodiment 1. But the LED device includes at least one ultraviolet LED chip in which emitting wavelength is 390-400 nm.

The green-converted phosphor is β-sialon green phosphor having the emitting peak wavelength of 525-535 nm and FWHM of 50-60 nm; the red-converted phosphor is nitride red phosphor having the emitting peak wavelength of 660-670 nm and FWHM of 90-100 nm; The special light-absorbing phosphor is tungstate $Na_5Y(MoO_4)_4:Sm^{3+}$ that has strong light-absorbing properties in the wavelength range of 460-510 nm.

In details, the proportion and concentration of β-sialon green and nitride red phosphor is determined by the desired color coordinate point of LED device, this embodiment provides the LED device in which color coordinate point is (0.26, 0.23). In the LED device, the weight proportion of green and red phosphor is 15:1, the weight percentage of both green plus red phosphor in the phosphor-converted layer is 18%, the weight percentage of the special light-absorbing phosphor $Na_5Y(MoO_4)_4:Sm^{3+}$ in the phosphor-converted layer is 1%, the rest of the phosphor-converted layer is silicon. The fabrication method of the LED device includes the steps: (a) LED chip 102 is attached in leadframe 101, mechanical and electrical connections between LED chip 102 and leadframe 101 are accomplished. (b) The mixture is formed by mixing three kinds of phosphor into the colloid. The three kinds of phosphor include β-sialon green, nitride red phosphor and special light-absorbing phosphor $Na_5Y(MoO_4)_4:Sm^+$. (c) The mixture is dispensed into the leadframe with controlled proper volume, and the mixture covers the surface of LED chip 102, and finally the phosphor-converted layer 103 is formed after curing.

Figure 4:
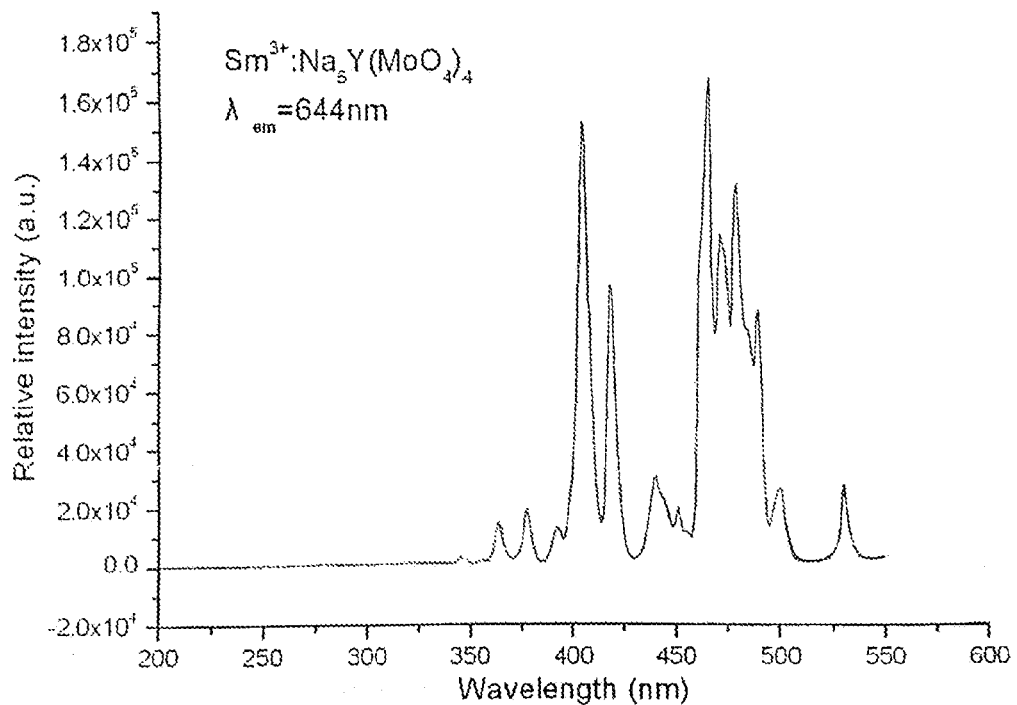
FIG. 4 is emitting spectra of the LED device according to the embodiment 2 of the present invention.

In this embodiment, the additive tungstate $Na_5Y(MoO_4)_4:Sm^{3+}$ has a strong absorption peak in the wavelength range of 460-510 nm, so it can effectively absorb the light in the overlapping region of chip ultraviolet light and green phosphor emitting light. Compared with conventional LED device fabricated only using G/R phosphor, this embodiment provides a LED device in which NTSC performance can increase 1-5%, and maximum NTSC performance can reach more than 95%. FIG. 4 gives the emitting spectra of the LED device according to this embodiment of the present invention.

The LED device of the present invention can be used in LED TV backlight module, including direct type or side-entering type backlight module, as introduced below in embodiment 3 and 4.

Embodiment 3

Figure 5:
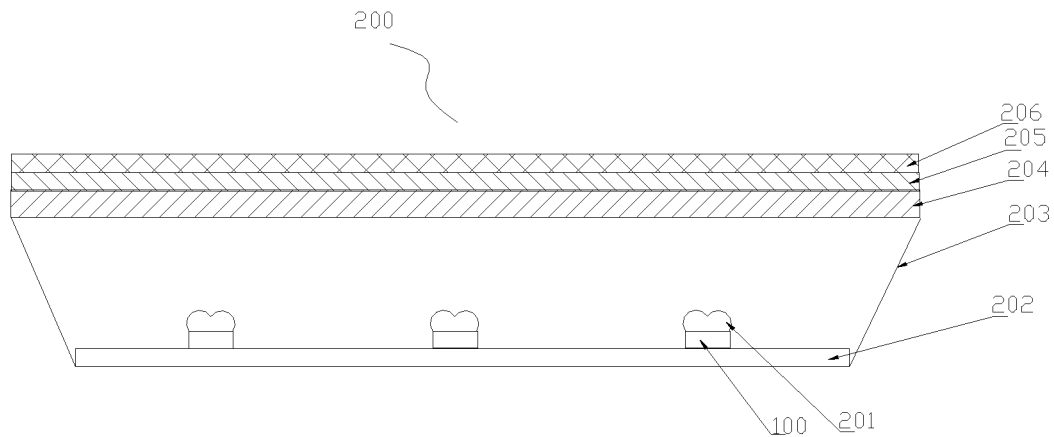
FIG. 5 is schematic diagram of direct type back-light module with high NTSC according to the embodiment 3 of the present invention.

FIG. 5 is schematic diagram of direct type back-light module with high NTSC according to the present invention. As shown in FIG. 5, the direct type back-light module 200 includes multiple LED devices 100 with high NTSC performance shown in the Embodiment 1 and 2, PCB 202, optical lens 201, diffuser plate 204, prism film 205, diffuse film 206 and back plate 203. The LED device 100 is attached on the PCB 202, and optical lens 201 is placed on the top of LED device 100. The PCB 202 with the LED device 100 is fixed on the bottom of back plate 203, and the diffuser plate 204 is placed on the top of the back plate 203. The prism film 205 is located on the top surface of the diffuser plate 204, and the diffuse film 206 is placed on the top surface of the prism film 205. For the direct type TV backlight module 200 of this embodiment of the present invention, the maximum NTSC performance can reach more than 95%.

Embodiment 4

Figure 6:
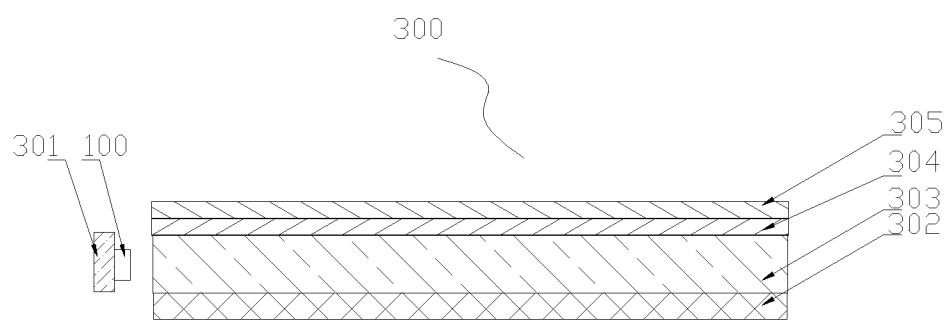
FIG. 6 is schematic diagram of side-entering type back-light module with high NTSC according to the embodiment 4 of the present invention.

FIG. 6 is schematic diagram of side-entering type back-light module with high NTSC according to the present invention. As shown in FIG. 6, the side-entering type back-light module 300 includes LED devices 100 with high NTSC performance shown in the Embodiment 1 and 2, PCB 301, light-guide plate 303, reflector film 302, brightness enhancement film 304 and diffuse film 305. The LED device 100 is attached on the PCB 301, and the PCB 301 is placed on the side of the light-guide plate 303. The reflector film 302 and brightness enhancement film 304 are respectively located on the lower and upper surface of the light-guide plate 303, and diffuse film 305 is placed on the top surface of brightness enhancement film 304. For the side-entering type TV backlight module 300 of this embodiment of the present invention, the maximum NTSC performance can reach more than 95%.

Figure 2:
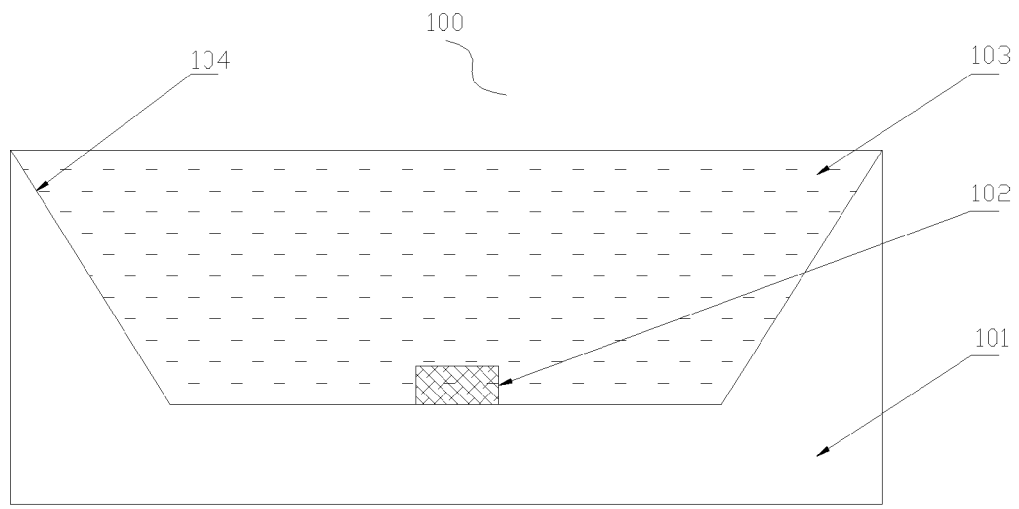
FIG. 2 is structure schematic diagram of the LED device according to the present invention.

FIG. 2 is a schematic diagram showing LED device structure of the present invention. As shown in FIG. 2, the LED device 100 contains a leadframe 101 with a trench 104. LED chip 102 is attached in the bottom of the trench 104. A phosphor-converted layer 103 is filled into the trench 104 and covers the surface of LED chip 102. However, in practical application, the LED device may not contain a leadframe or a leadframe trench. The key point of the present invention is the special phosphor-converted layer, so any form changes of the LED device are included in the present invention.

The foregoing descriptions are exemplary embodiments only, and are not intended to limit the scope, applicability or configuration of the invention in any way. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting device (LED) with wide color gamut (high NTSC), comprising at least one LED chip, wherein the LED chip is a blue or ultraviolet (UV) LED chip, a light-out surface of the LED chip is covered by a phosphor-converted layer which consists of phosphor converted materials and thermosetting colloid materials, the phosphor converted materials contain green-converted phosphor, red-converted phosphor and a phosphor material that has strong light-absorbing properties in the wavelength range of 460-510 nm, and the phosphor-converted layer contains 0.5-10% by weight of the phosphor material.

2. The LED according to claim 1, wherein the phosphor material with strong light-absorbing properties in the wavelength range of 460-510 nm has the following characteristics: its peak wavelength is the range of 460-510 nm, FWHM is less than 40 nm, absorption coefficient is in the range of $10^4$-$10^6$ L·mol$^{-1}$·cm$^{-1}$, no light is emitted or the emitting light is very weak in the wavelength range of 550-610 nm.

3. The LED according to claim 1, wherein the phosphor material with strong light-absorbing properties in the wavelength range of 460-510 nm is made up of one kind or several kinds of materials, including β-sialon doped by $Pr^{3+}$, tungstate and organic compound.

4. The LED according to claim 1, wherein the green phosphor-converted material has an emitting peak wavelength in the range of 510-545 nm and FWHM less than 70 nm.

5. The LED according to claim 4, wherein the green phosphor-converted material comprises one kind or several kinds of materials including β-sialon doped by $Eu^{2+}$, silicate and quantum dot.

6. The LED according to claim 1, wherein the red phosphor-converted material has an emitting peak wavelength in the range of 620-670 nm and FWHM less than 100 nm.

7. The LED according to claim 6, wherein the red phosphor-converted material comprises one kind or several kinds of materials including nitride, silicate, quantum dot, $K/Na_2SiF_6:Mn^{4+}$ and $K/Na_2TiF_6:Mn^{4+}$.

8. The LED according to claim 1, wherein the thermosetting colloid materials comprise one kind or several kinds of materials including silicone, silicone resin and epoxy resin.

9. A LED backlight module with wide color gamut (high NTSC), comprising at least one LED chip, wherein
the LED chip is a blue or ultraviolet (UV) LED chip, a light-out surface of the LED chip is covered by a phosphor-converted layer which consists of phosphor converted materials and thermosetting colloid materials, the phosphor converted materials contain green-converted phosphor, red-converted phosphor and a phosphor material that has strong light-absorbing properties in the wavelength range of 460-510 nm, and wherein the phosphor-converted layer comprises 0.5-10% by weight of the phosphor material.

10. The LED backlight module according to claim 9, wherein the phosphor material with strong light-absorbing properties in the wavelength range of 460-510 nm has the following characteristics: its peak wavelength is the range of 460-510 nm, FWHM is less than 40 nm, absorption coefficient is in the range of $10^4$-$10^6$ $L \cdot mol^{-1} \cdot cm^{-1}$, no light is emitted or the emitting light is very weak in the wavelength range of 550-610 nm.

11. The LED backlight module according to claim 9, wherein the phosphor material with strong light-absorbing properties in the wavelength range of 460-510 nm is made up of one kind or several kinds of materials, including β-sialon doped by $Pr^{3+}$, tungstate and organic compound.

12. The LED backlight module according to claim 9, wherein the green phosphor-converted material has an emitting peak wavelength in the range of 510-545 nm and FWHM less than 70 nm.

13. The LED backlight module according to claim 12, wherein the green phosphor-converted material comprises one kind or several kinds of materials including β-sialon doped by $Eu^{2+}$, silicate and quantum dot.

14. The LED backlight module according to claim 9, wherein the red phosphor-converted material has an emitting peak wavelength in the range of 620-670 nm and FWHM less than 100 nm.

15. The LED backlight module according to claim 14, wherein the red phosphor-converted material comprises one kind or several kinds of materials including nitride, silicate, quantum dot, $K/Na_2SiF_6:Mn^{4+}$ and $K/Na_2TiF_6:Mn^{4+}$.

16. The LED backlight module according to claim 9, wherein the thermosetting colloid materials comprise one kind or several kinds of materials including silicone, silicone resin and epoxy resin.

\* \* \* \* \*